(12) United States Patent
Kamei

(10) Patent No.: US 8,546,699 B2
(45) Date of Patent: Oct. 1, 2013

(54) GLASS-CERAMIC SUBSTRATE

(75) Inventor: Takafumi Kamei, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 462 days.

(21) Appl. No.: 12/779,878

(22) Filed: May 13, 2010

(65) Prior Publication Data

US 2011/0018671 A1    Jan. 27, 2011

(30) Foreign Application Priority Data

Jul. 23, 2009   (JP) ................. 2009-171759

(51) Int. Cl.
*H05K 1/03*   (2006.01)
*C03C 3/066*  (2006.01)

(52) U.S. Cl.
CPC ..................... *C03C 3/066* (2013.01)
USPC ......................... 174/256; 174/258

(58) Field of Classification Search
CPC ...................................... C03C 3/066
USPC ........ 174/250, 256, 257, 258, 259; 361/749, 361/762, 782, 811
See application file for complete search history.

(56) References Cited

U.S. PATENT DOCUMENTS

| | | | |
|---|---|---|---|
| 6,356,037 B1 * | 3/2002 | Sano et al. | 315/241 R |
| 2007/0085121 A1 * | 4/2007 | Mikura et al. | 257/295 |
| 2010/0323193 A1 * | 12/2010 | Matsuo et al. | 428/336 |

FOREIGN PATENT DOCUMENTS

| | | |
|---|---|---|
| JP | 6020839 | 1/1994 |
| JP | 6021264 | 1/1994 |
| JP | 2002-043759 A | 2/2002 |
| JP | 2004-221329 A | 8/2004 |
| JP | 2005-203723 A | 7/2005 |
| JP | 2008-105916 A | 5/2008 |

* cited by examiner

*Primary Examiner* — Yuriy Semenenko
(74) *Attorney, Agent, or Firm* — Procopio, Cory, Hargreaves & Savitch LLP

(57) ABSTRACT

A glass-ceramic substrate with improved bonding strength between an insulating and ferrite layer, and method of manufacturing same are disclosed. The glass-ceramic substrate comprises a glass-ceramic layer, a ferrite layer, and interlayer means between the glass-ceramic layer and the ferrite layer. The glass-ceramic layer comprises a glass phase and a glass comprising a first crystal. The ferrite layer comprises a ferrite crystal.

12 Claims, 7 Drawing Sheets

|  |  | No. 1 | No. 2 | No. 3 |
|---|---|---|---|---|
| TEM observation (N=1) | Interlayer | $ZnFe_2O_4$ / $FeAl_2O_4$ / $ZnAl_2O_4$ | N/A | N/A |
| Percolation test with fluorescent flaw detection solution (N=5) | Fluid infiltration | None | Infiltration | Infiltration |
|  |  | None | Infiltration | Infiltration |
|  |  | None | Infiltration | Infiltration |
|  |  | None | Infiltration | Infiltration |
|  |  | None | Infiltration | Infiltration |
|  | Assessment | 5/5 OK | 5/5 NG | 5/5 NG |
| Three-point bending strength test (N=5) | Measured value (MPa) | 182 | 124 | 150 |
|  |  | 196 | 136 | 138 |
|  |  | 183 | 97 | 127 |
|  |  | 177 | 129 | 161 |
|  |  | 186 | 86 | 113 |
|  | Mean value (MPa) | 185 | 114 | 138 |

Figure 3

| No. | ferrite crystals | | | main elements in glass |
|---|---|---|---|---|
| | chemical formula | crystal structure | lattice parameter (Å) | |
| 4 | FeFe$_2$O$_4$ | spinel | 8.40 | Si, Al, Zn, Mg |
| 5 | FeFe$_2$O$_4$ | spinel | 8.40 | Si, Al, Zn, Mg |
| 6 | FeFe$_2$O$_4$ | spinel | 8.40 | Si, Al, Zn, Mg |
| 7 | FeFe$_2$O$_4$ | spinel | 8.40 | Si, Al, Co, Mn |
| 8 | FeFe$_2$O$_4$ | spinel | 8.40 | Si, Al, Cd, In |
| 9 | FeFe$_2$O$_4$ | spinel | 8.40 | Si, Al, Zn, Mg |
| 10 | FeFe$_2$O$_4$ | spinel | 8.40 | Si, Al, Zn, Mg |
| 11 | FeFe$_2$O$_4$ | spinel | 8.40 | Si, Al, Zn, Co, Mg |
| 12 | MnFe$_2$O$_4$ | spinel | 8.50 | Si, Al, Zn, Mg |
| 13 | MnFe$_2$O$_4$ | spinel | 8.50 | Si, Al, Zn, Mg |
| 14 | MnFe$_2$O$_4$ | spinel | 8.50 | Si, Al, Zn, Mg |
| 15 | MnFe$_2$O$_4$ | spinel | 8.50 | Si, Al, Co, Mn |
| 16 | MnFe$_2$O$_4$ | spinel | 8.50 | Si, Al, Cd, In |
| 17 | MnFe$_2$O$_4$ | spinel | 8.50 | Si, Al, Zn, Mg |
| 18 | MnFe$_2$O$_4$ | spinel | 8.50 | Si, Al, Zn, Mg |
| 19 | MnFe$_2$O$_4$ | spinel | 8.50 | Si, Al, Zn, Co, Mg |
| 20 | NiFe$_2$O$_4$ | spinel | 8.34 | Si, Al, Zn, Mg |
| 21 | NiFe$_2$O$_4$ | spinel | 8.34 | Si, Al, Zn, Mg |
| 22 | NiFe$_2$O$_4$ | spinel | 8.34 | Si, Al, Zn, Mg |
| 23 | NiFe$_2$O$_4$ | spinel | 8.34 | Si, Al, Co, Mn |

Figure 4

| No. | ferrite crystals | | | main elements in glass |
|---|---|---|---|---|
| | chemical formula | crystal structure | lattice parameter (Å) | |
| 24 | $NiFe_2O_4$ | spinel | 8.34 | Si, Al, Cd, In |
| 25 | $NiFe_2O_4$ | spinel | 8.34 | Si, Al, Zn, Mg |
| 26 | $NiFe_2O_4$ | spinel | 8.34 | Si, Al, Zn, Mg |
| 27 | $NiFe_2O_4$ | spinel | 8.34 | Si, Al, Zn, Co, Mn |
| 28 | $ZnFe_2O_4$ | spinel | 8.44 | Si, Al, Zn, Mg |
| 29 | $ZnFe_2O_4$ | spinel | 8.44 | Si, Al, Zn, Mg |
| 30 | $ZnFe_2O_4$ | spinel | 8.44 | Si, Al, Co, Mn |
| 31 | $ZnFe_2O_4$ | spinel | 8.44 | Si, Al, Cd, In |
| 32 | $ZnFe_2O_4$ | spinel | 8.44 | Si, Al, Zn, Mg |
| 33 | $ZnFe_2O_4$ | spinel | 8.44 | Si, Al, Zn, Co, Mn |
| 34 | $FeFe_2O_4$ | spinel | 8.40 | Si, Zn, Mg |
| 35 | $FeFe_2O_4$ | spinel | 8.40 | Si, Al, Zn, Cd, In |
| 36 | $MnFe_2O_4$ | spinel | 8.50 | Si, Al, Zn, Cd, In |
| 37 | $NiFe_2O_4$ | spinel | 8.34 | Si, Al, Zn, Cd, In |
| 38 | $ZnFe_2O_4$ | spinel | 8.44 | Si, Al, Zn, Cd, In |
| 39 | $FeFe_2O_4$ | spinel | 8.40 | Si, Al, Cd, Mn |
| 40 | $FeFe_2O_4$ | spinel | 8.40 | Si, Al, Mg, Mn |
| 41 | $FeFe_2O_4$ | spinel | 8.40 | Si, Al, Mg, Mn |
| 42 | $BaFe_{12}O_{19}$ | magnetpranbite | 5.88 | Si, Al, Mg, Mn |
| 43 | $BaFe_{12}O_{20}$ | magnetpranbite | 5.88 | Si, Al, Mg, Mn |
| 44 | $BaFe_{12}O_{21}$ | magnetpranbite | 5.88 | Si, Al, Mg, Mn |

Figure 5

| No. | first crystal | | | second crystal | | | difference in lattice parameter (%) | | percolation tests using a fluorescent flaw detection solution |
|---|---|---|---|---|---|---|---|---|---|
| | chemical formula | crystal structure | lattice parameter (Å) | chemical formula | crystal structure | lattice parameter (Å) | D1 | D2 | |
| 4 | Mg$_2$SiO$_4$ | spinel | 8.22 | ZnFe$_2$O$_4$ | spinel | 8.44 | 0.47 | 2.60 | 5/5 OK |
| 5 | Mg$_2$SiO$_4$ | spinel | 8.22 | FeAl$_2$O$_4$ | spinel | 8.15 | 3.1 | 0.86 | 5/5 OK |
| 6 | Mg$_2$SiO$_4$ | spinel | 8.22 | ZnAl$_2$O$_4$ | spinel | 8.08 | 4.0 | 1.7 | 5/5 OK |
| 7 | Mg$_2$SiO$_4$ | spinel | 8.22 | Co$_2$MnO$_4$ | spinel | 8.97 | 6.4 | 8.4 | 5/5 OK |
| 8 | Mg$_2$SiO$_4$ | spinel | 8.22 | Cd$_2$InO$_4$ | spinel | 9.17 | 8.4 | 10.4 | 5/5 OK |
| 9 | ZnAl$_2$O$_4$ | spinel | 8.08 | ZnFe$_2$O$_4$ | spinel | 8.44 | 0.47 | 4.3 | 5/5 OK |
| 10 | ZnAl$_2$O$_4$ | spinel | 8.08 | FeAl$_2$O$_4$ | spinel | 8.08 | 4.0 | 0.0 | 5/5 OK |
| 11 | ZnAl$_2$O$_4$ | spinel | 8.08 | Co$_2$MnO$_4$ | spinel | 8.97 | 6.4 | 9.9 | 5/5 OK |
| 12 | Mg$_2$SiO$_4$ | spinel | 8.22 | ZnFe$_2$O$_4$ | spinel | 8.44 | 0.71 | 2.6 | 5/5 OK |
| 13 | Mg$_2$SiO$_4$ | spinel | 8.22 | FeAl$_2$O$_4$ | spinel | 8.15 | 4.3 | 0.86 | 5/5 OK |
| 14 | Mg$_2$SiO$_4$ | spinel | 8.22 | ZnAl$_2$O$_4$ | spinel | 8.08 | 5.2 | 1.7 | 5/5 OK |
| 15 | Mg$_2$SiO$_4$ | spinel | 8.22 | Co$_2$MnO$_4$ | spinel | 8.97 | 5.2 | 8.4 | 5/5 OK |
| 16 | Mg$_2$SiO$_4$ | spinel | 8.22 | Cd$_2$InO$_4$ | spinel | 9.17 | 7.3 | 10.4 | 5/5 OK |
| 17 | ZnAl$_2$O$_4$ | spinel | 8.08 | ZnFe$_2$O$_4$ | spinel | 8.44 | 0.71 | 4.3 | 5/5 OK |
| 18 | ZnAl$_2$O$_4$ | spinel | 8.08 | FeAl$_2$O$_4$ | spinel | 8.08 | 5.2 | 0.0 | 5/5 OK |
| 19 | ZnAl$_2$O$_4$ | spinel | 8.08 | Co$_2$MnO$_4$ | spinel | 8.97 | 5.2 | 9.9 | 5/5 OK |
| 20 | Mg$_2$SiO$_4$ | spinel | 8.22 | ZnFe$_2$O$_4$ | spinel | 8.44 | 1.2 | 2.6 | 5/5 OK |
| 21 | Mg$_2$SiO$_4$ | spinel | 8.22 | FeAl$_2$O$_4$ | spinel | 8.15 | 2.3 | 0.86 | 5/5 OK |
| 22 | Mg$_2$SiO$_4$ | spinel | 8.22 | ZnAl$_2$O$_4$ | spinel | 8.08 | 3.2 | 1.7 | 5/5 OK |
| 23 | Mg$_2$SiO$_4$ | spinel | 8.22 | Co$_2$MnO$_4$ | spinel | 8.97 | 7.0 | 8.4 | 5/5 OK |

Figure 6

| No | first crystal | | | second crystal | | | difference in lattice parameter (%) | | percolation tests using a fluorescent flaw detection solution |
|---|---|---|---|---|---|---|---|---|---|
| | chemical formula | crystal structure | lattice parameter (Å) | chemical formula | crystal structure | lattice parameter (Å) | σ1 | σ2 | |
| 24 | Mg$_2$SiO$_4$ | spinel | 8.22 | InCd$_2$O$_4$ | spinel | 9.17 | 9.1 | 10.4 | 5/5 OK |
| 25 | ZnAl$_2$O$_4$ | spinel | 8.08 | ZnFe$_2$O$_4$ | spinel | 8.44 | 1.2 | 4.3 | 5/5 OK |
| 26 | ZnAl$_2$O$_4$ | spinel | 8.08 | ZnAl$_2$O$_4$ | spinel | 8.08 | 3.2 | 0.0 | 5/5 OK |
| 27 | ZnAl$_2$O$_4$ | spinel | 8.08 | MnCo$_2$O$_4$ | spinel | 8.97 | 7.0 | 9.9 | 5/5 OK |
| 28 | Mg$_2$SiO$_4$ | spinel | 8.22 | FeAl$_2$O$_4$ | spinel | 8.15 | 3.6 | 0.86 | 5/5 OK |
| 29 | Mg$_2$SiO$_4$ | spinel | 8.22 | ZnAl$_2$O$_4$ | spinel | 8.08 | 4.5 | 1.7 | 5/5 OK |
| 30 | Mg$_2$SiO$_4$ | spinel | 8.22 | MnCo$_2$O$_4$ | spinel | 8.97 | 5.9 | 8.4 | 5/5 OK |
| 31 | Mg$_2$SiO$_4$ | spinel | 8.08 | InCd$_2$O$_4$ | spinel | 9.17 | 8.0 | 10.4 | 5/5 OK |
| 32 | ZnAl$_2$O$_4$ | spinel | 8.08 | FeAl$_2$O$_4$ | spinel | 8.08 | 4.5 | 0.0 | 5/5 OK |
| 33 | ZnAl$_2$O$_4$ | spinel | 8.08 | MnCo$_2$O$_4$ | spinel | 8.97 | 5.9 | 9.9 | 5/5 OK |
| 34 | Mg$_2$SiO$_4$ | spinel | 8.22 | ZnMn$_2$O$_4$ | spinel | 9.24 | 9.1 | 11.0 | 1/5 NG |
| 35 | ZnAl$_2$O$_4$ | spinel | 8.08 | InCd$_2$O$_4$ | spinel | 9.17 | 8.4 | 11.9 | 3/5 NG |
| 36 | ZnAl$_2$O$_4$ | spinel | 8.08 | InCd$_2$O$_4$ | spinel | 9.17 | 7.3 | 11.9 | 3/5 NG |
| 37 | ZnAl$_2$O$_4$ | spinel | 8.08 | InCd$_2$O$_4$ | spinel | 9.17 | 9.1 | 11.9 | 3/5 NG |
| 38 | ZnAl$_2$O$_4$ | spinel | 8.08 | InCd$_2$O$_4$ | spinel | 9.17 | 8.0 | 11.9 | 3/5 NG |
| 39 | Mg$_2$SiO$_4$ | spinel | 8.22 | MnCo$_2$O$_4$ | spinel | 9.35 | 10.2 | 12.1 | 4/5 NG |
| 40 | Mg$_2$SiO$_4$ | spinel | 8.22 | MgMn$_2$O$_4$ | spinel | 9.75 | 13.8 | 15.7 | 5/5 OK |
| 41 | Mg$_2$SiO$_4$ | spinel | 8.22 | MnMg$_2$O$_4$ | spinel | 5.72 | 46.9 | 45.7 | 5/5 OK |
| 42 | Mg$_2$SiO$_4$ | spinel | 8.22 | ZnFe$_2$O$_4$ | spinel | 8.44 | 35.3 | 2.6 | 5/5 OK |
| 43 | Mg$_2$SiO$_4$ | spinel | 8.22 | FeAl$_2$O$_4$ | spinel | 8.15 | 27.9 | 0.86 | 5/5 OK |
| 44 | Mg$_2$SiO$_4$ | spinel | 8.22 | ZnAl$_2$O$_4$ | spinel | 8.08 | 27.2 | 1.7 | 5/5 OK |

Figure 7

GLASS-CERAMIC SUBSTRATE

CROSS-REFERENCE TO RELATED APPLICATION

The present application claims priority under 35 U.S.C. §119 to Japanese Patent Application No. 2009-171759, filed on Jul. 23, 2009, entitled "GLASS CERAMIC SUBSTRATE, GLASS CERAMIC CIRCUIT BOARD COMPRISING COIL AND MANUFACTURING METHOD OF THE SAME". The content of which is incorporated by reference herein in its entirety.

FIELD

Embodiments of the present invention relate generally to multilayer circuit board, and more particularly relate to a thin multilayer circuit board comprising conducting layers and insulating layers alternatively on a substrate.

BACKGROUND

Electronic devices such as cellular phones and other mobile communication devices may include many built-in electronic devices. Miniaturization of such electronic devices has progressed with miniaturization and "low-profiling" of electronic parts and components of the electronic devices. For example, LC filters may comprise a substrate and a relatively large chip coil or chip capacitor on the substrate.

Some LC filters comprise a ferrite layer with high magnetic permeability inside a ceramic substrate and a coil conductor embedded in the ferrite layer. Ceramic substrates may comprise a pair of insulating layers comprising wiring, and a ferrite layer between the pair of insulating layers. The ferrite layer comprises a flat coil conductor embedded therein. In order to reduce an electrical loss caused by electrical resistance in the wiring and the flat coil conductor, a low-resistance metal such as low-resistance Copper (Cu) or Silver (Ag) may be used for the wiring and the flat coil conductor. Since such a low-resistance metal generally has a relatively low melting point, a glass-ceramic substrate is generally manufactured by simultaneously firing the insulating layers and the ferrite layer.

SUMMARY

A glass-ceramic substrate with improved bonding strength between an insulating and ferrite layer, and a method of manufacturing of same are disclosed.

In a first embodiment, a glass-ceramic substrate comprises a glass-ceramic layer, a ferrite layer, and an interlayer between the glass-ceramic layer and ferrite layer. The glass-ceramic layer comprises a glass phase and a glass comprising a first crystal. The ferrite layer comprises a ferrite crystal, and the interlayer comprises a second crystal. The second crystal comprises a crystal structure isomorphic to a first crystal and the ferrite crystal. A difference in lattice constants between the second crystal and the ferrite crystal is at most about 10% of a lattice constant of the second crystal. A difference in lattice constants between the second crystal and the first crystal is at most about 10% of a lattice constant of the second crystal.

A second embodiment comprises a manufacturing method of a glass-ceramic substrate comprising insulating layers, a ferrite layer between two insulating layer and an interlayer between one of the insulating layers and the ferrite layer. The manufacturing method comprises preparing a plurality of ceramic green sheets, preparing a ferrite green sheet comprising $FeFe_2O_4$, laminating the ceramic green sheet and the ferrite green sheet to obtain a resulting laminate, and sintering the resulting laminate. The plurality of ceramic green sheets comprises about 10 to about 40 mass % of forsterite, about 22 to about 52 mass % of $SiO_2$, about 2 to about 12 mass % of $B_2O_3$, about 9 to about 29 mass % of $Al_2O_3$, about 9 to about 29 mass % of ZnO, about 1 to about 9 mass % of CaO, and about 7 to about 21 mass % of MgO.

A third embodiment comprises a glass-ceramic substrate comprising: a glass-ceramic layer, a ferrite layer and interlayer means between the glass-ceramic layer and the ferrite layer. The glass-ceramic layer comprises a glass phase, and a glass comprising a first crystal. The ferrite layer comprises a ferrite crystal.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the present disclosure. The figures are provided to facilitate understanding of the present disclosure without limiting the breadth, scope, scale, or applicability of the present disclosure. The drawings are not necessarily made to scale.

FIG. 3 is a table showing exemplary experimental results according to various embodiments of the disclosure.

FIG. 4 is a table showing exemplary experimental results according to various embodiments of the disclosure.

FIG. 5 is a table showing exemplary experimental results according to various embodiments of the disclosure.

FIG. 6 is a table showing exemplary experimental results according to various embodiments of the disclosure.

FIG. 7 is a table showing exemplary experimental results according to various embodiments of the disclosure.

DETAILED DESCRIPTION OF EXEMPLARY EMBODIMENTS

The following description is presented to enable a person of ordinary skill in the art to make and use the embodiments of the disclosure. The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding technical field, background, brief summary or the following detailed description. The present disclosure should be accorded scope consistent with the claims, and not limited to the examples described and shown herein.

Embodiments of the disclosure are described herein in the context of one practical non-limiting application, namely, a glass-ceramic substrate. Embodiments of the disclosure, however, are not limited to such glass-ceramic substrate, and the techniques described herein may also be utilized in other applications. For example, embodiments may be applicable to multilayer circuit boards, and the like.

As would be apparent to one of ordinary skill in the art after reading this description, these are merely examples and the embodiments of the disclosure are not limited to operating in accordance with these examples. Other embodiments may be utilized and structural changes may be made without departing from the scope of the exemplary embodiments of the present disclosure.

Figure 1:
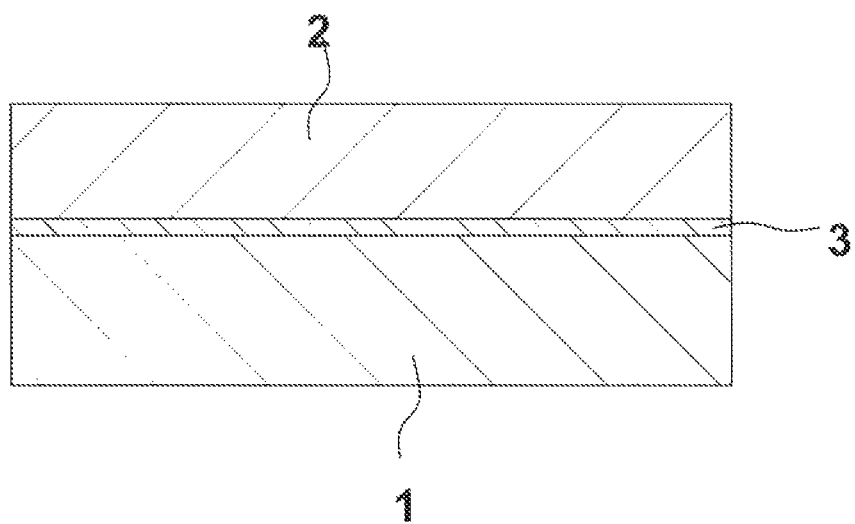
FIG. 1 is an illustration of a schematic cross sectional view of an exemplary glass-ceramic substrate according to an embodiment of the disclosure.

FIG. 1 illustrates a schematic cross sectional view of a glass-ceramic substrate according to an embodiment of the present disclosure. The glass-ceramic substrate comprises a ferrite layer 1, an insulating layer 2, and an interlayer 3 located between the insulating layer 1 and the ferrite layer 2.

The ferrite layer 1 comprises a second crystal. The second crystal may have a spinel crystal structure, and the spinel crystal structure may comprise a solid solution. A main component of the spinel crystal structure may be, for example but without limitation, $FeFe_2O_4$, and the like.

The solid solution may be formed with the following ferromagnetic ferrites:

Ni—Zn ferrites indicated as X—$Fe_2O_4$ (wherein X is Cu, Ni, or Zn), Mn—Zn ferrites indicated as Y—$Fe_2O_4$ (wherein Y is Mn or Zn), Mg—Zn ferrites indicated as Z—$Fe_2O_4$ (wherein Z is Mg or Zn), and Ni—Co ferrites indicated as U—$Fe_2O_4$ (wherein U is Ni or Co). Because Ni—Zn ferrites have sufficiently high magnetic permeability in high-frequency bands, they can be used at frequencies of about 100 kHz or higher. If a Ni—Zn ferrite is used, a composition ratio of a sintered body made from the solid solution may comprise about 63-73 percent by mass of $FeFe_2O_4$, about 5-10 percent by mass of CuO, about 5-12 percent by mass of NiO, and about 10-23 percent by mass of ZnO. High-density firing at a sintered density of about 5 $g/cm^3$ or more is possible at a temperature range equal to or less than about 800° C.-1,000° C. A temperature for firing the glass ceramics contained in an insulating layer 2, and a sufficiently high magnetic permeability can be obtained in high-frequency bands.

$FeFe_2O_4$ is a main component of ferrite of the solid solution. According to one embodiment, a sufficient magnetic permeability can be obtained using a proportion of $FeFe_2O_4$ of the ferrite of about 63 percent by mass or more. In another embodiment, the proportion of $FeFe_2O_4$ of the ferrite is about 73 percent by mass or less. In this manner, a mechanical strength of the ferrite may be retained without decreasing a sintered density of the ferrite. CuO may be added to the ferrite to lower a sintering temperature. Using sintering-promoting effects of formation of a liquid phase by CuO at low temperatures, firing can be conducted at a low temperature range of about 800-1000° C. without impairing magnetic properties of the ferrite.

In one embodiment, a proportion of CuO of the ferrite is about 5 percent by mass or more. In this manner, the sintered density of the ferrite may be increased when firing is conducted together with the wiring layer and a flat coil conductor at a temperature range of about 800-1000° C., thus allowing the mechanical strength to be retained. In another embodiment, the proportion of CuO of the ferrite is about 10 percent by mass or less. In this manner a proportion of $CuFe_2O_4$, which has low magnetic properties, is suppressed thus making the magnetic properties substantially easy to preserve.

NiO is contained in order to secure a magnetic permeability of the ferrite layer 1 in high-frequency bands. $NiFe_2O_4$ does not cause decay of the magnetic permeability due to resonance up to high-frequency bands. $NiFe_2O_4$ can maintain the magnetic permeability at a relatively high value up to high-frequency bands. However, due to low initial magnetic permeability of $NiFe_2O_4$, in one embodiment, a proportion of $NiFe_2O_4$ is about 5 percent by mass or more. In this manner, the magnetic permeability can be retained without any decrease in high-frequencies of about 10 MHz or more. In another embodiment, a proportion of $NiFe_2O_4$ is about 12 percent by mass or less, thereby the initial magnetic permeability can be maintained at a high value.

ZnO is an important component for improving the magnetic permeability of the ferrite layer 1. In one embodiment, the proportion of ZnO in a ferrite composition is about 10 percent by mass or more, thereby the magnetic permeability can be retained at a high value. In another embodiment, a proportion of ZnO is about 23 percent by mass or less, thereby magnetic properties can be favorably maintained.

In an embodiment, the insulating layer 2 comprises glass-ceramics. The glass-ceramics comprise glass and a first crystal. The glass may comprise, for example but without limitation, $SiO_2$, $SiO_2$—$B_2O_3$, $SiO_2$—$Al_2O_3$, $SiO_2$-MO (where M indicates Ca, Sr, Mg, Ba, or Zn), $SiO_2$—$B_2O_3$-MO, $SiO_2$-$M^1$O-$M^2$O (wherein either of or both $M^1$ and $M^2$ indicate Ca, Sr, Mg, Ba, or Zn), $SiO_2$—$B_2O_3$-$M^1$O-$M^2$O, $SiO_2$-$M^3{}_2$O (wherein $M^3$ indicates Li, Na, or K), $SiO_2$—$B_2O_3$-$M^3{}_2$O, or the like. Also, the glass may comprise Co, Cd, In, or an oxide thereof.

According to an embodiment, the first crystal may have the same spinel structure as a ferrite crystal, such as but without limitation, forsterite ($Mg_2SiO_4$), gahnite ($ZnAl_2O_4$), and the like.

The first crystal may be, for example but without limitation, contained in a ceramic green sheet, a crystal formed from the crystallization of glass components during firing of a ceramic green sheet, a crystal formed from glass components and filler components, or the like. Glass forming a spinel structure through crystallization may comprise, for example but without limitation, $SiO_2$—$Al_2O_3$—MgO glass (where a molar ratio of MgO relative to $Al_2O_3$ is about 0.8-1.2), $SiO_2$—MgO glass (where a molar ratio of MgO relative to $SiO_2$ is about 1.8-2.2), $SiO_2$—$Al_2O_3$—ZnO glass (where a molar ratio of ZnO relative to $Al_2O_3$ is about 0.8-1.2), $SiO_2$—CoO—$MnO_2$ glass (where a molar ratio of CoO relative to $MnO_2$ is about 1.8-2.2), and $SiO_2$—CdO—$InO_2$ glass (where a molar ratio of CdO relative to $InO_2$ is about 1.8-2.2).

The first crystal may be formed from the crystallization of glass components during firing of a ceramic green sheet. In one embodiment, the glass components comprise MgO and filler components comprise $SiO_2$ thereby the glass components and filler components crystallize to form $Mg_2SiO_4$ during firing of the ceramic green sheet. Alternatively, the glass components comprise ZnO and the filler components comprise $Al_2O_3$, thereby the glass components and filler components crystallize to form $ZnAl_2O_4$ during firing of the ceramic green sheet. Alternatively, the glass components comprise $Al_2O_3$ and the filler components comprise $Fe_2O_3$, thereby the glass components and filler components crystallize to form $FeAl_2O_4$ during firing of the ceramic green sheet. For a green sheet comprising the first crystal as filler, the first crystal may comprise, for example but without limitation, forsterite ($Mg_2SiO_4$), gahnite ($ZnAl_2O_4$), and the like.

The interlayer 3 contains at least one second crystal, and the interlayer 3 may comprise a glass. The second crystal may comprise, for example but without limitation, $ZnFe_2O_4$, $FeFe_2O_4$, $FeAl_2O_4$, $ZnAl_2O_4$, $Co_2MnO_4$, $CdIn_2O_4$, or the like. The second crystal is located at a boundary face of the interlayer 3 and the ferrite layer 1. According to an embodiment, the second crystal is distributed over a substantially entire area of the boundary face. A ceramic green sheet may comprise, for example but without limitation, $SiO_2$—$B_2O_3$—$Al_2O_3$—$ZnO$—$MgO$ glass, and a ferrite green sheet may comprise, for example but without limitation, Ni—Zn ferrite, and the like. When the ceramic green sheet and the ferrite green sheets are layered and fired, the interlayer 3 is formed through the reaction of the ceramic green sheet and the ferrite green sheet. The glass components in the insulating ceramics soften and flow in the firing temperature region and sinter while depositing $ZnFe_2O_4$, $FeAl_2O_4$, and $ZnAl_2O_4$ on the boundary face with the ferrite layer, and the deposited layer becomes the interlayer 3. $ZnFe_2O_4$, $FeAl_2O_4$, and $ZnAl_2O_4$ are present in the ferrite layer 1 and the interlayer 3 and strengthen the bond of the boundary face.

A crystal structure of the first crystal, a crystal structure of the second crystal, and a crystal structure of the ferrite crystal are substantially isomorphic. According to an embodiment, the identical crystal structure may be a crystal system such as, for example but without limitation, a cubic crystal, tetragonal crystal, hexagonal crystal, rhombic crystal, or the like. The cubic crystals may be further classified into, for example but without limitation, simple cubic crystals, body-centered cubic crystals, face-centered cubic crystals (represented in Bravais lattices), and the like. A more specific crystal structure may be specified, such as but without limitation, a spinel structure, a corundum structure, a perovskite structure, or the like.

A crystal structure of the second crystal and a crystal structure of the ferrite crystal are substantially isomorphic. A lattice constant difference (D1) between the second crystal and the ferrite crystal crystals is about 10% or less from a lattice constant of the second crystal. The crystal structure of the second crystal and the crystal structure of the first crystal are substantially isomorphic. A lattice constant difference (D2) between the second crystal and the first crystal is about 10% or less from a lattice constant of the second crystal. As a result, voids and gaps on the boundary face between the ferrite layer 1 and the interlayer 3 decrease, and/or voids and gaps on the boundary face between the insulating layer 2 and the interlayer 3 decrease. Also as a result, a bonding strength between the ferrite layer 1 and the insulating layer 2 is increased.

In one embodiment, the second crystal comprises some elements contained in the first crystal (first set of chemical elements) and some elements contained in the ferrite crystal (a third set of chemical elements). In this manner, a bonding strength between elements of the second crystal (second set of chemical elements) in the interlayer 3, and both the first crystal in the insulating layer 2 and the ferrite crystal in the ferrite layer 1 becomes high. Moreover, the bonding strength between the insulating layer 2 and the ferrite layer 2 is further increased. This is because the bonding strength is higher in bonds between identical elements compared to bonds between different elements. For example, the bonding strength is higher, when: the ferrite crystal is $FeFe_2O_4$, the first crystal is $ZnAl_2O_4$ comprising a subset of the third set, and the second crystal is $ZnFe_2O_4$ comprising a subset of the first set.

In one embodiment, the second crystal is formed by layering and firing the ceramic green sheet acting as the insulating layer 2 and the ferrite green sheet acting as the ferrite layer 1. In this manner, a glass-ceramic substrate can be substantially easily produced with a high bonding strength between the insulating layer 2 and the ferrite layer 1 through a normal laminated-body production process and firing process.

In one embodiment, the first crystal comprises forsterite ($Mg_2SiO_4$) as its main phase, the ferrite crystal comprises $FeFe_2O_4$ as its main phase, and the second crystal comprises one of $ZnFe_2O_4$, $FeAl_2O_4$, or $ZnAl_2O_4$ as its main phase. The first crystal, the ferrite crystal, and the second crystal comprise a spinel structure. A lattice constant difference (D1) between the second crystal and the ferrite crystal may be about 5% or less of the lattice constant of the second crystal. Also, the lattice constant difference (D2) between the second crystal and the first crystal may be about 5% or less of the lattice constant of the second crystal. A bond between the insulating layer 2 and the interlayer 3 is formed by a bond between the first crystal and a glassy phase (glass phase) of the glass ceramics on one hand and the interlayer 3 on the other.

In one embodiment, because coefficients of thermal expansion of the forsterite ($Mg_2SiO_4$) of the first crystal and the $FeFe_2O_4$ of the ferrite crystal are close, occurrence of cracks, caused by stress generated from differences in thermal expansion during firing processes and subsequent heating processes or reliability assessment processes, are reduced.

A transmission electron microscope (TEM) may be used to confirm the crystal structure. In this method, first, a cutting process for the ceramic substrate and a polishing process for a cut surface are performed to prepare the surface of the crystal structure to be confirmed (i.e., any of the ferrite layer 1, the insulating layer 2, or the interlayer 3) for observation under the TEM. Then, the diffraction grating image on the cut surface of that layer is observed and the crystal structure is identified.

For phases that are already known, the crystal phase may be identified by referring to JPCDS cards. For example, because the crystal structures and diffraction grating images for $ZnFe_2O_4$, $FeAl_2O_4$, and $ZnAl_2O_4$ are described on JPCDS cards ($ZnFe_2O_4$: JPCDS No. 22-1012; $FeAl_2O_4$: JPCDS No. 34-0192; $ZnAl_2O_4$: JPCDS No. 5-669), it is easy to confirm whether the above crystal phases have been deposited.

Alternatively, the crystal structure may be identified using X-ray diffractometry instead of the method described above. First, a cutting process for the ceramic substrate and a polishing process for the cut surface are performed to prepare the desired surface for observation through X-ray diffraction. Then, a diffraction grating image can be obtained by irradiating X-rays to the cross-section of that surface. The X-rays are irradiated within a region of around 10 $\mu m^2$ so that only part of the desired layer is irradiated.

Next, D1 and D2 may be determined as follows. If the first crystal, the second crystal, and the ferrite crystal each have the same crystal structure, the distances from the origin of the diffraction grating image to points corresponding to the same surface orientation of each crystal are measured. When the distances from the origin of the diffraction grating image to the points corresponding to the same surface orientation of each of the first crystal, the second crystal, and the ferrite crystal are defined as d1, d2, and d3, respectively, a ratio between the lattice constant difference (D2) of the first crystal and the second crystal and the lattice constant of the second crystal can be calculated using the formula $D2=(1/d1-1/d2)\times d2$, and a ratio between the lattice constant difference (D1) of the second crystal and the lattice crystal and the lattice constant of the second crystal can be calculated using the formula $D1=(1/d2-1/d3)\times d2$.

Next, a manufacturing method for a glass-ceramic wiring board for cases in which the interlayer 3 is formed from a reaction of a ceramic green sheet and a ferrite green sheet is described below. A ceramic green sheet for the insulating layer 2 and a ferrite green sheet for the ferrite layer 1 are each prepared, and the ceramic green sheet and the ferrite green sheet are layered to produce a green sheet laminate. The green sheet laminate is then fired.

The ceramic green sheet comprises a glass powder, a filler powder, and an organic binder. The glass powder is glass powder of the glassy phase described above. In one embodiment, the filler powder may be as described above. Alternatively, depending on electrical properties and mechanical properties of the insulating layer 2, the filler powder may comprise, for example but without limitation, a composite oxide of $Al_2O_3$, $SiO_2$, $ZrO_2$, and an alkaline earth metal oxide; a composite oxide of $TiO_2$ and an alkaline earth metal oxide; a composite oxide comprising at least one of either $Al_2O_3$ or $SiO_2$ (e.g., spinel, mullite, or cordierite); or the like.

The ferrite green sheet for the ferrite layer 1 comprises a powder organic binder of the ferrite crystal described above. For example, powder obtained by precalcining $FeFe_2O_4$ with CuO, ZnO, or NiO is used as the ferrite powder.

The ferrite powder has an average particle diameter of about 0.1-0.9 μm, and the grain shape may be close to a spherical shape. The ferrite green sheet is produced using the ferrite powder.

For the organic binder, binders that have conventionally been used for ceramic green sheets may be used. The conventional binders may comprise, for example but without limitation, homopolymers or copolymers of acrylics (i.e., acrylic acid, methacrylic acid, homopolymers or copolymers of esters thereof; specifically, acrylic acid ester copolymers, methacrylic acid ester copolymers, acrylic acid ester-methacrylic acid ester copolymers, etc.), polyvinyl butyral, polyvinyl alcohol, acrylic styrene, polypropylene carbonate, celluloses, or the like. According to an embodiment, an acrylic binder is used based on considerations of the resolvability and volatility during the firing process.

The ceramic green sheet and the ferrite green sheet are produced by preparing a slurry for each, applying respective slurries using a coating method such as the doctor-blade method, and drying the solvent in the respective slurry. The slurry for producing the green sheets is prepared by adding about 5-20 parts by mass of organic binder and about 15-50 parts by mass of organic solvent for about every 100 parts by mass of insulating powder or ferrite powder and mixing using a mixing means such as a ball mill to obtain a viscosity of about 3-100 cps. Any organic solvent may be used as long as the insulating powder or ferrite powder can be dispersed and mixed well with the organic binder. For example but with limitation, the organic solvent may comprise toluene, ketone or alcohol organic solvents, water, or the like. According to an embodiment, a solvent with a high evaporation coefficient, such as but without limitation, toluene, methyl ethyl ketone, isopropyl alcohol, or the like, can be used to perform the drying process after slurry application in a shorter time.

For producing the green sheet laminate, methods such as but without limitation; thermocompression bonding whereby heat and pressure are applied to a layered ceramic green sheet and ferrite green sheet; thermocompression bonding whereby an adhesive agent composed of: an organic binder, a plasticizer, and a solvent is applied between the sheets; or the like may be used. Conditions for heat and pressure application during lamination differ depending on a type and quantity of the organic binder being used. For example, conditions may be generally about 30-100° C. and 2-30 MPa, respectively. In this process, in order to ensure that the ceramic green sheet and the ferrite green sheet have a width corresponding to the required properties for the glass-ceramic substrate, a necessary number of green sheets according to the sheet thickness may be laminated.

After performing binder removal at a temperature of about 300-600° C., the green sheet laminate is fired at a temperature of about 800-1000° C.

Specifically, for the insulating powder of the ceramic green sheet, a powder having about 10-40 percent by mass of a filler composed of forsterite and about 60-90 percent by mass of glass comprising about 22-52 percent by mass of $SiO_2$, about 2-12 percent by mass of $B_2O_3$, about 9-29 percent by mass of $Al_2O_3$, 9-29 percent by mass of ZnO, about 1-9 percent by mass of CaO, and about 7-21 percent by mass of MgO, wherein the molar ratio of ZnO relative to $Al_2O_3$ is about 0.8-1.2, is used, and for the ferrite green sheet of the ferrite layer 1, a sheet having a ferrite crystal with $FeFe_2O_4$ as the main phase is used.

In this case, $ZnFe_2O_4$, $FeAl_2O_4$, and $ZnAl_2O_4$ are deposited between the insulating layer 1 and the ferrite layer 2 as the second crystal, and the interlayer 3 is formed. In the glass composition described above, it becomes easy to deposit the $ZnFe_2O_4$, $FeAl_2O_4$, $ZnAl_2O_4$ forming the second crystal on the boundary face of the ferrite layer 1 and the insulating layer 2. In one embodiment, a molar ratio of ZnO relative to $Al_2O_3$ is about 0.8-1.2, thereby the $ZnAl_2O_4$ is easy to deposit in a firing temperature region of about 800-1000° C. Consequently, a glass-ceramic substrate with improved bonding strength of the ferrite layer 1 and the insulating layer 2 can be easily produced.

Figure 2:
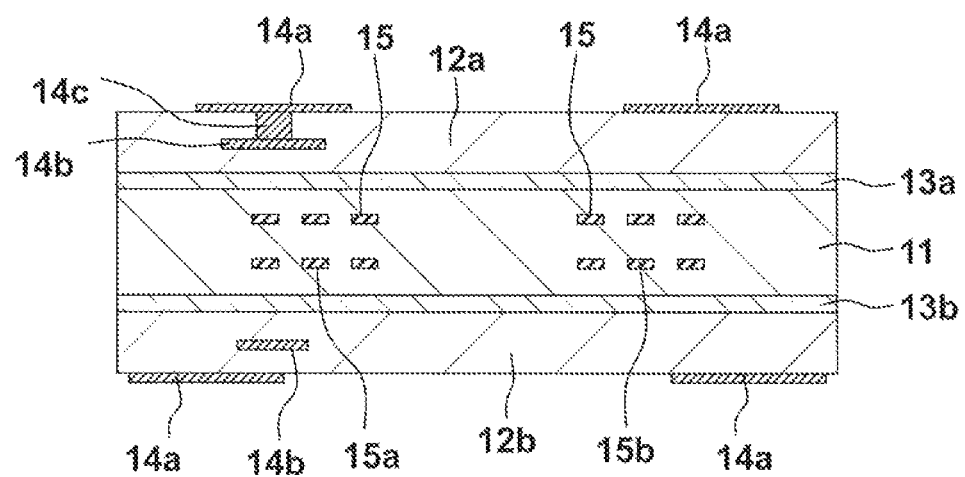
FIG. 2 is an illustration of a schematic cross sectional view of an exemplary glass-ceramic substrate comprising a coil therein according to an embodiment of the disclosure.

FIG. 2 illustrates a schematic cross sectional view of a glass-ceramic substrate comprising a coil therein, according to an embodiment of the present disclosure. In an embodiment, a glass-ceramic substrate comprises two insulating layers 12a and 12b and a ferrite layer 11. That is, the glass-ceramic substrate comprises a ferrite layer 11, insulating layers 12a and 12b, and interlayers 13a and 13b. The glass-ceramic substrate further comprises wiring conductors 14a-14c, and flat coil conductors 15a and 15b. The interlayers 13a is located between the ferrite layer 11 and the insulating layer 12a. The interlayer 13b is located between the ferrite layer 11 and the insulating layer 12b.

The glass-ceramic substrate with a built-in coil in the embodiment shown in FIG. 2 comprises two insulating layers 12a and 12b, the ferrite layer 11 provided between these insulating layers 12a and 12b with a ferrite crystal, and the interlayers 13a and 13b provided between each of the insulating layers 12a and 12b, and the ferrite layer 1.

Because the insulating layer 12 comprises glass-ceramics, insulation resistance is generally higher than that of ferrite. Because glass-ceramics, which have a high bonding strength with a wiring conductors 14a-14c, are positioned on a surface of the glass-ceramic substrate, the insulation reliability is high. Thus, a glass-ceramic wiring board with high mounting reliability when mounting parts on the wiring conductors 14a-14c or for mounting on an external circuit board via the wiring conductors 14a-14c is obtained.

The wiring conductors 14a-14c are located on the surface or inside the insulating layer 12a and/or 12b and comprise a metalized metal that is a sintered body of a powder of a low-resistance metal, such as but without limitation, Cu, Ag, Au, Pt, and Ag—Pd alloy, a Ag—Pt alloy, or the like. A wiring conductor pattern for each of the wiring conductors 14a-14c is formed by printing a conductor paste comprising the above metallic powder on the ceramic green sheet, and the wiring conductor is formed through simultaneous firing with the ceramic green sheet. A surface wiring conductor 14a is formed on an outer surface of the glass-ceramic substrate (insulating layer 12a and/or 12b) and acts as an external wiring conductor for mounting electrical parts on the outer surface or for mounting on an external circuit board via a brazing filler metal. An internal wiring conductor 14b is located inside the insulating layer 12a and/or 12b, and a connecting conductor 14c connects either the surface wiring conductor 14a with the internal wiring conductor 14b or multiple internal wiring conductors 14b.

A flat coil conductor 15a or 15b is a metalized metal layer that is a sintered body of a metallic powder similar to the wiring conductors 14a-14c. By using the Cu, Ag, Au, Pt, and Ag—Pd alloy and an Ag—Pt alloy, the electrical resistance of the flat coil conductors 15a and 15b can be made small.

The flat coil conductors 15a and 15b is embedded in (i.e., built into) the ferrite layer 11 if the coil pattern is formed by printing conductor paste on the surface of the ferrite green sheet, layering the green sheet for the ferrite layer 11 thereon, and performing simultaneous firing. In the embodiment shown in FIG. 2, two triple-wound flat coil conductors 15a and 15b are arranged by being stacked on top of one another. In one embodiment, multiple coil conductors 15a and 15b are formed by being stacked on top of one another, a through conductor pattern may be formed to be used as through conductors for connecting either the coil patterns constituting the coil conductors 15a and 15b amongst themselves or the coil conductors with the internal wiring layer.

In one embodiment, the glass-ceramic wiring board with a built-in coil is produced by forming a wiring conductor pattern and a coil conductor pattern for the ceramic green sheet and the ferrite green sheet in the manufacturing method for the glass-ceramic substrate described above. For a glass-ceramic wiring board with a built-in coil shown in FIG. 2, a laminated body is produced by arranging a predetermined number of insulating layer green sheets, each with a wiring pattern formed, above and below a predetermined number of ferrite green sheets comprising those with coil conductor patterns formed, and a ceramic substrate is produced by firing this laminated body.

The wiring conductor pattern used for the wiring conductors 14a-14c is formed by printing conductor paste for the wiring conductors 14a-14c on the surface of the green sheet for the insulating layers 12a and 12b in a predetermined pattern. The wiring conductor pattern is formed by using printing methods, such as but without limitation, a screen printing method, a gravure printing method, or the like. A through conductor used as the wiring conductors 14a-14c is formed by: first forming a through-hole in the green sheet for the insulating layer 2 through, for example but without limitation, a punching process, a laser process, and the like before forming the wiring conductor pattern; and then filling this through-hole with the conductor paste for the wiring conductors 14a-14c using an embedding means, such as but without limitation, printing, press filling, or the like.

Similarly, the coil conductor used as the flat coil conductor 5 is formed by printing conductor paste for the flat coil conductor 5 on the surface of the green sheet for the ferrite layer 11 in a predetermined pattern using a printing method such as, for example but without limitation, a screen printing method, a gravure printing method, or the like. The wiring pattern used for the through conductor inside the ferrite layer 11 is also formed in a similar manner as the wiring conductor pattern used for the above through conductor. For the conductor paste for the flat coil conductors 15a and 15b, the same conductor paste as that used for the wiring conductors 14a-14c may be used. Depending, for example but without limitation, on the required inductance value and size of the flat coil conductors 15a and 15b, if the coil conductor pattern used for the flat coil conductors 15a and 15b is formed through printing as described above, it can be prepared substantially easily if the line width and the distance between the adjacent conductors of the outer and inner peripheries are around 0.1 mm or more.

The conductor paste for the wiring conductors 14a-14c and the flat coil conductors 15a and 15b is produced by: adding, for example but with without limitation, an organic binder, organic solvent, and, if necessary, a dispersant, and the like to the metallic powder constituting the main component; and then mixing and kneading using a kneading means such as, for example but without limitation a ball mill, a triple roll mill, or a planetary mixer, or the like.

For the organic binder of the conductor paste, binders conventionally used for conductor paste may be used. The binders may comprise, for example but with without limitation, homopolymers or copolymers of acrylics (e.g., acrylic acid, methacrylic acid, or homopolymers or copolymers of esters thereof; specifically, acrylic acid ester copolymers, methacrylic acid ester copolymers, acrylic acid ester-methacrylic acid ester copolymers, etc.), polyvinyl butyral, polyvinyl alcohol, acrylic styrene, polypropylene carbonate, celluloses, and the like. Considering the resolvability and volatility during the firing process, acrylic and alkyd organic binders are more favorable.

The organic solvent of the conductor paste may be any solvent allowing the above metallic powder and organic binder to be dispersed and mixed favorably such as, for example but without limitation, terpineol, butyl carbitol acetate, phthlatic acid, and the like.

By adding about 3-15 parts by mass of organic binder and about 10-30 parts by mass of organic solvent to about 100 parts by mass for metallic conductor powder and kneading, the conductor paste for the wiring conductors 14a-14c and the conductor paste for the flat conductors 15a and 15b are prepared with a viscosity allowing for favorable pattern formation in a predetermined shape through printing without generating defects such as bleeding or thinning or the conductor paste.

By adjusting an amount of solvent and organic binder, the conductor paste for forming the wiring pattern used as the through conductor can be regulated in a paste form with relatively low fluidity compared to the conductor paste for the wiring conductors 14a-14a or the conductor paste for the flat coil conductors 15a and 15b so that the conductor paste can fill the through-hole easily and harden when heated. Moreover, in order to regulate the sintering behavior, the conductor paste may contain inorganic components in which glass and ceramics powders are added to a metallic conductor powder.

For a firing atmosphere, if the flat coil conductor 15a and 15b, and the wiring conductors 14a-14c are composed of materials that are difficult to oxidize, such as Ag, firing is conducted under normal atmospheric conditions, and if the conductors are composed of easily oxidizable materials such as Cu, a nitrogen atmosphere is used, and a humidified atmosphere is used to facilitate binder removal.

Using a plating method, a nickel layer and a metal layer should be sequentially adhered to the surface of the wiring conductors 14a-14c formed on the surface of the glass-ceramic wiring board with a built-in coil after firing in order to enhance bonds with, for example but without limitation, semiconductor chips, chip parts, external electrical circuits through soldering, or the like.

As mentioned above, the present disclosure is not limited to the example embodiments described above, and various modifications may be made within the scope of the substance of the present disclosure. For example, as explained above, in an embodiment, the laminated body is produced by arranging ceramic green sheets for the insulating layers 12a and 12b above and below the ferrite green sheets for the ferrite layer 11, and the glass-ceramic substrate is produced by firing this laminated body. Alternatively, in another embodiment, the glass-ceramic substrate may be produced by first producing and firing a laminated body with ferrite green sheets and then layering ceramic green sheets above and below the laminated body and firing the laminated body.

Moreover, instead of forming the interlayers 13a and 13b through reactions between the ceramic green sheets and the ferrite green sheets, an intermediate green sheet comprising the second crystal may be produced, layered between the ceramic green sheets and the ferrite green sheets, and fired.

Example 1

First, about 80 percent by mass of glass powder comprising about 37 percent by mass of $SiO_2$, about 7 percent by mass of $B_2O_3$, about 19 percent by mass of $Al_2O_3$, about 17 percent by mass of ZnO, about 5 percent by mass of CaO, and about 15 percent by mass of MgO was mixed with about 20 percent by mass of forsterite powder (filler powder) to prepare insulating powder. About 12 percent by mass of acrylic resin (organic binder), about 6 percent by mass of phthlatic acid plasticizer (plasticizer), and about 30 percent by mass of toluene (solvent) were added to about 100 percent by mass of the insulating powder, and mixed using the ball mill method to prepare a slurry. Using the slurry so obtained, a ceramic green sheet with a thickness of about 160 μm to be used as an insulating layer 2 was formed with the doctor-blade method.

A through-hole with a diameter of about 150 μm was formed on the obtained ceramic green sheet through a punching process using a mold. Through-conductor paste was filled into this through-hole using the screen printing method and dried for about 30 minutes at about 70° C. For the through-conductor paste, a conductor paste was prepared by adding about 12 parts by mass of acrylic resin and about 2 parts by mass of α-terpineol (organic solvent) to about 100 parts by mass of Ag powder and about 10 parts by mass of glass powder (sintering aid) and sufficiently mixed using a defoaming mixer and sufficiently kneaded with a triple roll mill was used.

Next, the conductor paste was applied to the ceramic green sheet over about a 2-mm² area at a thickness of about 20 μm using the screen printing method and dried for about 30 minutes at about 70° C. to prepare the wiring conductor pattern.

For the conductor paste, a paste that was prepared by adding about 12 parts by mass of acrylic resin and about 2 parts by mass of α-terpineol (organic solvent) to about 100 parts by mass of Ag powder (metallic powder) and sufficiently mixed using a defoaming mixer and sufficiently kneaded with a triple roll mill was used.

Next, about 700 g of $FeFe_2O_4$ powder, about 60 g of CuO powder, about 60 g of NiO powder, about 180 g of ZnO powder, and about 4,000 cm³ of purified water were collected in a pot with a capacity of about 7,000 cm³ together with zirconia balls, and after mixing for about 24 hours by rotating the pot in a ball mill, the dried mixed powder was collected in a zirconia crucible and heated for about 1 hour at about 730° C. under normal atmospheric conditions to produce a ferromagnetic ferrite powder. For about 100 parts by mass of this ferrite powder, about 10 parts by mass of butyral resin (organic binder) and about 45 parts by mass of IPA (organic solvent) were added and mixed using the same ball mill method as that described above to prepare a slurry. Using the slurry so obtained, a ferrite green sheet with a thickness of about 100 μm was formed using a doctor-blade method.

A through-hole with a diameter of about 150 μm to be used for the through conductor was formed on the ferrite green sheet through a punching process using a mold. This through-hole was filled with through-conductor paste using the screen printing method and dried for about 30 minutes at about 70° C. to form a through-conductor composition to be used as the through conductor. For the through-conductor paste, the same paste as that described above was used.

Next, conductor paste was applied to each of two of these ferrite green sheets at a thickness of about 30 μm using the screen printing method and dried for about 30 minutes at about 70° C. to form a flat coil conductor pattern. For the conductor paste, a paste that was prepared by adding about 10 parts by mass of acrylic resin and about 1 part by mass of α-terpineol (organic solvent) to about 100 parts by mass of Ag powder and sufficiently mixed using a defoaming mixer was used.

Next, two ferrite green sheets on which the flat coil conductor pattern was formed were layered together, four insulating layer green sheets were stacked both above and below the ferrite green sheets, and thermocompression bonding was performed at a pressure of about 20 MPa and a temperature of about 55° C. to produce a laminated body in which the insulating layer green sheets were positioned as the surface layers.

Next, after heating the laminated body for about 3 hours at about 500° C. under normal atmospheric conditions to remove organic components, it was fired for about 1 hour at about 900° C. under normal atmospheric conditions to produce a glass-ceramic wiring board with a built-in coil shown in FIG. 2.

Using an electroless plating method, an Ni plated membrane and an Au plated membrane were sequentially formed on the wiring conductor formed on the outer surface of this glass-ceramic wiring board with a built-in coil.

In example No. 2, a ceramic substrate with a built-in coil and no interlayer was produced. With the exception of using an insulating powder prepared by mixing about 80 percent by mass of $SiO_2$ glass powder (glass powder) with about 20 percent by mass of alumina powder (filling powder), a glass-ceramic wiring board with a built-in coil was produced in similar manner as example No. 1.

In example No. 3, using the same glass-ceramic green sheets as those used in example No. 1, a ceramic substrate with a built-in coil using a different ferrite green sheet from the embodiment was produced. With the exception of using the hard ferrite powder $BaFe_2O_{19}$ (M type) as the ferrite powder, the ceramic substrate with a built-in coil was produced in a similar manner as example No. 1. However, the ferrite layer 11 of the produced glass-ceramic wiring board with a built-in coil was not sintered and many voids and gaps were observed.

For the ceramic substrates of examples No. 1 to 3 obtained as described above, percolation tests using a fluorescent flaw detection solution and transverse rupture strength tests were performed. Moreover, the ferrite layers 11, the insulating layers 12a and 12b, and the interlayers 13a and 13b of the glass-ceramic wiring boards with built-in coils of examples No. 1 to 3 were observed under a TEM.

In the percolation tests using a fluorescent flaw detection solution, each glass-ceramic substrate was immersed in the fluorescent flaw detection solution, left for about 2 hours under a pressure of about 0.5 MPa, and removed from the fluorescent flaw detection solution before polishing the side surfaces of the glass-ceramic wiring board with a built-in coil and checking whether the fluorescent flaw detection solution had infiltrated between the insulating layer 12a and/or 12b, and the ferrite layer 11. For substrates in which infiltration was observed, it was determined that voids and gaps had been formed on the boundary face of the insulating layer 12a and/or 12b and the ferrite layer 11.

For the transverse rupture strength tests, three-point bending strength tests of each glass-ceramic wiring board with a built-in coil were performed. The three-point bending strength σ(Pa) can be calculated with the formula $\sigma=3PL/(2Wt^2)$, wherein P(N) is the breaking load, L(m) is the span, W(m) is the sample width, and t(m) is the sample thickness. The breaking load was measured using the Autograph AG-IS (Shimadzu Corporation). The sample width and sample thickness were measured using a vernier caliper and a micrometer, respectively.

For the TEM observations, first, in order to allow the glass-ceramic wiring board with a built-in coil to be observed under a TEM from the cross-sectional direction, after performing the cutting and polishing processes for the substrate, the interlayer 3 was prepared for observation under a TEM. The transmission electron microscope JEM-2010F (JEOL) was used. After conducting image observations and specifying whether an interlayer 3 was present, for substrates with an interlayer 3, the crystal structure of the interlayer 3 was identified by observing diffraction grating images of the interlayer 3. The crystal phase was identified using JPCDS cards.

The results of the percolation tests using the fluorescent flaw detection solution, the three-point bending strength tests, the TEM observations are shown in FIG. 3, wherein N indicates the number of measurements (e.g., for N=5, the results were obtained from measurements of 5 samples).

As shown in FIG. 3, in the glass-ceramic wiring board with a built-in coil of example No. 1, the interlayer 3 is formed, but no interlayer is formed in the glass-ceramic wiring boards with built-in coils of examples No. 1 and No. 2.

Moreover, based on the results of the TEM observations, in the glass-ceramic wiring board with a built-in coil of example No. 1, $ZnFe_2O_4$ was formed on the insulating layers 12a and 12b, $ZnFe_2O_4$, $FeAl_2O_4$, and $ZnAl_2O_4$ were formed on the interlayers 13a and 13b, and $FeFe_2O_4$ was formed on the ferrite layer 11, and all were identical crystal structures with a spinel structure. Moreover, the lattice constant difference between the $ZnFe_2O_4$ formed on the insulating layers 12a and 12b, and the $ZnFe_2O_4$, $FeAl_2O_4$, and $ZnAl_2O_4$ formed on the interlayers 13a and 13b, and the lattice constant difference between the $ZnFe_2O_4$, $FeAl_2O_4$, and $ZnAl_2O_4$ formed on the interlayers 13a and 13b and the $FeFe_2O_4$ formed on the ferrite layer 11 were both within 10% of the lattice constant of the $ZnFe_2O_4$, $FeAl_2O_4$, and $ZnAl_2O_4$ formed on the interlayers 13a and 13b.

In the glass-ceramic wiring board with a built-in coil comprising the interlayer 13a and 13b with the above characteristics, there was no infiltration of the fluorescent flaw detection solution in the substrate. On the other hand, in the glass-ceramic wiring boards with the built-in coils of examples No. 1 and 2, which each had a high three-point bending strength but no interlayer formed, there was infiltration of the fluorescent flaw detection solution in the substrate, and it was observed that the three-point bending strength was low compared to example No. 1.

The above results show that the glass-ceramic wiring board with the built-in coil of example No. 1 comprising the interlayers 13a and 13b formed between the ferrite layer 11 and the insulating layers 12a and 12b respectively, is a highly reliable glass-ceramic substrate. Similarly, the glass-ceramic substrates in which neither a coil conductor nor a wiring conductor are formed is highly reliable.

Example 2

Based on the crystal structures of the first crystal, the second crystal, and the ferrite crystal and the lattice constant differences of these crystals, we compared the status of occurrence of voids and gaps in the boundary face of the insulating layer 12a and 12b, and the ferrite layer 11.

A glass-ceramic green sheet with a thickness of about 81 μm was formed by mixing about 80 percent by mass of glass powder comprising main elements of the glass contained in glass ceramics (FIGS. 4 and 5) with about 20 percent by mass of forsterite ($Mg_2SiO_4$) or gahnite ($ZnAl_2O_4$) powder (filler powder).

Next, using the ferrite powder comprising the ferrite crystal shown in FIGS. 4 and 5, a ferrite green sheet with a thickness of about 100 μm as in example No. 1 was formed.

Then, 8 of the ferrite green sheets were layered together and 2 ceramic green sheets were stacked both above and below the green sheets and thermocompression bonding was performed at a pressure of about 20 MPa and a temperature of about 55° C. to produce a laminated body in which the ceramic green sheets were positioned as the surface layers.

After cutting the obtained laminated body to a size of about 30× about 35 mm, it was heated for about 1 hour at about 400° C. under normal atmospheric conditions to remove organic components, after which it was fired for about 1 hour at about 900° C. under normal atmospheric conditions to obtain a glass-ceramic substrate shown in FIG. 1.

For the samples No. 4-44 obtained in this manner, as in example No. 1, percolation tests using a fluorescent flaw detection solution and TEM observations were conducted. The results are shown in FIGS. 6 and 7.

Regarding the first crystal, although some samples were observed to have multiple crystals, the main crystals were the forsterite ($Mg_2SiO_4$) or the gahnite ($ZnAl_2O_4$) used as filler. The second crystal differed depending on the type of glass (main elements of the glass) used for the ceramic green sheet, even when the same ferrite crystal and filler powder were used. Furthermore, even when the same type of glass (main elements of the glass) was used, the second crystal differed depending on the composition. FIGS. 6 and 7 shows the first crystal and the second crystal as the main type of crystals among multiple crystals.

In samples No. 4-34, in which the ferrite crystal, the first crystal, and the second crystal each had identical crystal structures and the lattice constant difference between the second crystal and the first crystal as well as the lattice constant difference between the second crystal and the first crystal were within about 10% of the lattice constant of the second crystal, there was no infiltration of the fluorescent flat detection solution. In contrast, in samples No. 3-13, there was infiltration of the fluorescent flaw detection solution. These results confirm that in the glass-ceramic substrates of the embodiments described above, wherein the interlayer 3 comprising the second crystal is formed, the crystal structures of the ferrite crystal, the first crystal, and the second crystal are substantially isomorphic, and the lattice constant difference between the second crystal and the ferrite crystal as well as the lattice constant difference between the second crystal and the first crystal are each within about 10% of the lattice constant of the second crystal, no voids or gaps are generated between the ferrite layer 1 and the insulating layer 2, and as a result, a ceramic substrate with high bonding strength between the ferrite layer 1 and the insulating layer 2 is obtained.

While at least one exemplary embodiment has been presented in the foregoing detailed description, the present disclosure is not limited to the above-described embodiment or embodiments. Variations may be apparent to those skilled in the art. In carrying out the present disclosure, various modifications, combinations, sub-combinations and alterations may occur in regard to the elements of the above-described embodiment insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof. Furthermore, although embodiments of the present disclosure have been described with reference to the accompanying drawings, it is to be noted that changes and modifications may be apparent to those skilled in the art. Such changes and modifications are to be understood as being included within the scope of the present disclosure as defined by the claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. The term "about" when referring to a numerical value or range is intended to encompass values resulting from experimental error that can occur when taking measurements.

The invention claimed is:

1. A glass-ceramic substrate comprising:
   a glass-ceramic layer comprising:
      a glass phase; and
      a glass comprising a first crystal;
   a ferrite layer comprising a ferrite crystal; and
   an interlayer between the glass-ceramic layer and the ferrite layer, the interlayer comprising a second crystal having
   a crystal structure isomorphic to a crystal structure of the first crystal and a crystal structure of the ferrite crystal, wherein the first crystal comprises $Mg_2SiO_4$, the ferrite crystal comprises $FeFe_2O_4$, and the second crystal comprises at least one of $ZnFeO_4$, $FeAl_2O_4$, and $ZnAl_2O_4$,
   a difference in lattice constants between the second crystal and the ferrite crystal is at most about 10% of a lattice constant of the second crystal, and
   a difference in lattice constants between the second crystal and the first crystal is at most about 10% of the lattice constant of the second crystal.

2. The glass-ceramic substrate according to claim 1, wherein:
   the first crystal comprises a first set of chemical elements;
   the second crystal comprises a second set of chemical elements;
   the ferrite crystal comprises a third set of chemical elements;
   the second set comprises a subset of the first set; and
   the second set comprises a subset of the third set.

3. The glass-ceramic substrate according to claim 1, wherein the interlayer and the ferrite layer are located between two insulating layers among a plurality of insulating layers.

4. The glass-ceramic substrate according to claim 1, further comprising:
   a conducting line on an insulating layer; and
   a coil in the ferrite layer.

5. The glass-ceramic substrate according to claim 3, further comprising:
   a conducting line on at least one of the two insulating layers; and
   a coil in the ferrite layer.

6. A glass-ceramic substrate comprising:
   a glass-ceramic layer comprising:
      a glass phase; and
      a glass comprising a first crystal;
   a ferrite layer comprising a ferrite crystal; and
   interlayer means between the glass-ceramic layer and the ferrite layer, wherein the first crystal comprises $Mg_2SiO_4$, the ferrite crystal comprises $FeFe_2O_4$, and a second crystal comprises at least one of $ZnFeO_4$, $FeAl_2O_4$, and $ZnAl_2O_4$.

7. The glass-ceramic substrate according to claim 6, wherein the interlayer means comprises a second crystal.

8. The glass-ceramic substrate according to claim 7, wherein a crystal structure of the second crystal is isomorphic to a crystal structure of the first crystal and a crystal structure of the ferrite crystal.

9. The glass-ceramic substrate according to claim 7, wherein a difference in lattice constants between the second crystal and the ferrite crystal is at most about 10% of a lattice constant of the second crystal.

10. The glass-ceramic substrate according to claim 7, wherein a difference in lattice constants between the second crystal and the first crystal is at most about 10% of a lattice constant of the second crystal.

11. The glass-ceramic substrate according to claim 6, wherein the interlayer means and the ferrite layer are located between two insulating layers among a plurality of insulating layers.

12. The glass-ceramic substrate according to claim 6, further comprising:
   a conducting line on an insulating layer; and
   a coil in the ferrite layer.

* * * * *